United States Patent
Ogami

(10) Patent No.: US 8,042,093 B1
(45) Date of Patent: Oct. 18, 2011

(54) SYSTEM PROVIDING AUTOMATIC SOURCE CODE GENERATION FOR PERSONALIZATION AND PARAMETERIZATION OF USER MODULES

(75) Inventor: Kenneth Y. Ogami, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 869 days.

(21) Appl. No.: 09/998,848

(22) Filed: Nov. 15, 2001

(51) Int. Cl.
*G06F 9/44* (2006.01)

(52) U.S. Cl. ........................................ 717/109; 717/113

(58) Field of Classification Search ............ 717/106–113
See application file for complete search history.

(56) References Cited

U.S. PATENT DOCUMENTS

| | | | |
|---|---|---|---|
| 4,061,987 A | 12/1977 | Nagahama | |
| 4,134,073 A | 1/1979 | MacGregor | |
| 4,138,671 A | 2/1979 | Comer et al. | |
| 4,272,760 A | 6/1981 | Prazak et al. | |
| 4,344,067 A | 8/1982 | Lee | |
| 4,689,740 A | 8/1987 | Moelands et al. | |
| 4,692,718 A | 9/1987 | Roza et al. | |
| 4,827,401 A | 5/1989 | Hrustich et al. | |
| 4,868,525 A | 9/1989 | Dias | |
| 4,947,169 A | 8/1990 | Smith et al. | |
| 5,050,168 A | 9/1991 | Paterson | |
| 5,128,871 A * | 7/1992 | Schmitz | 716/17 |
| 5,140,197 A | 8/1992 | Grider | |
| 5,150,079 A | 9/1992 | Williams et al. | |
| 5,155,836 A | 10/1992 | Jordan et al. | |
| 5,175,884 A | 12/1992 | Suarez | |
| 5,200,751 A | 4/1993 | Smith | |
| 5,202,687 A | 4/1993 | Distinti | |
| 5,258,760 A | 11/1993 | Moody et al. | |
| 5,304,955 A | 4/1994 | Atriss et al. | |
| 5,319,370 A | 6/1994 | Signore et al. | |
| 5,331,571 A | 7/1994 | Aronoff et al. | |
| 5,345,195 A | 9/1994 | Cordoba et al. | |
| 5,371,860 A | 12/1994 | Mura et al. | |
| 5,399,922 A | 3/1995 | Kiani et al. | |
| 5,414,308 A | 5/1995 | Lee et al. | |

(Continued)

FOREIGN PATENT DOCUMENTS

EP  0308583A2 A1  3/1989

(Continued)

OTHER PUBLICATIONS

Ashok Bindra, "Programmable SoC Delivers A New Level of System Flexibility", Electronic Design, Nov. 6, 2000. 11 pages.*

(Continued)

*Primary Examiner* — Ted T Vo

(57) ABSTRACT

A method and system of automatically generating source code for configuring a programmable microcontroller. The method involves displaying virtual blocks in a computerized design system where the virtual blocks correspond to programmable circuit blocks in a microcontroller chip. The user selects a user module that defines a particular function to be performed on the microcontroller. The user assigns the virtual blocks to the user module. The design system then automatically generates source code for configuring the programmable blocks to perform the desired function. The source code can then be assembled, linked and loaded into the microcontroller's memory system. When executed on the microcontroller, the executable code will then set registers within the blocks to implement the function. Source code is automatically generated for: (1) realizing the user module in a hardware resource; and also (2) to configure the user module to behave in a prescribed manner.

22 Claims, 17 Drawing Sheets

U.S. PATENT DOCUMENTS

| | | |
|---|---|---|
| 5,426,378 A | 6/1995 | Ong |
| 5,428,319 A | 6/1995 | Marvin et al. |
| 5,430,687 A | 7/1995 | Hung et al. |
| 5,438,672 A | 8/1995 | Dey |
| 5,440,305 A | 8/1995 | Signore et al. |
| 5,479,643 A | 12/1995 | Bhaskar et al. |
| 5,546,433 A | 8/1996 | Tran et al. |
| 5,552,748 A | 9/1996 | O'Shaughnessy |
| 5,557,762 A | 9/1996 | Okuaki et al. |
| 5,559,502 A | 9/1996 | Schutte |
| 5,563,526 A | 10/1996 | Hastings et al. |
| 5,574,892 A | 11/1996 | Christensen |
| 5,590,354 A | 12/1996 | Klapproth et al. |
| 5,594,734 A | 1/1997 | Worsley et al. |
| 5,600,262 A | 2/1997 | Kolze |
| 5,604,466 A | 2/1997 | Dreps et al. |
| 5,614,861 A | 3/1997 | Harada |
| 5,630,102 A | 5/1997 | Johnson et al. |
| 5,633,766 A | 5/1997 | Hase et al. |
| 5,670,915 A | 9/1997 | Cooper et al. |
| 5,680,070 A | 10/1997 | Anderson et al. |
| 5,684,434 A | 11/1997 | Mann et al. |
| 5,689,196 A | 11/1997 | Schutte |
| 5,699,024 A | 12/1997 | Manlove et al. |
| 5,703,871 A | 12/1997 | Pope et al. |
| 5,710,906 A | 1/1998 | Ghosh et al. |
| 5,745,011 A | 4/1998 | Scott |
| 5,781,747 A | 7/1998 | Smith et al. |
| 5,828,693 A | 10/1998 | Mays et al. |
| 5,870,004 A | 2/1999 | Lu |
| 5,870,345 A | 2/1999 | Stecker |
| 5,872,464 A | 2/1999 | Gradinariu |
| 5,880,598 A | 3/1999 | Duong |
| 5,889,936 A | 3/1999 | Chan |
| 5,898,345 A | 4/1999 | Namura et al. |
| 5,903,718 A | 5/1999 | Marik |
| 5,939,949 A | 8/1999 | Olgaard et al. |
| 5,968,135 A | 10/1999 | Teramoto et al. |
| 5,982,229 A | 11/1999 | Wong et al. |
| 6,018,559 A | 1/2000 | Azegami et al. |
| 6,140,853 A | 10/2000 | Lo |
| 6,144,327 A | 11/2000 | Distinti et al. |
| 6,157,270 A | 12/2000 | Tso |
| 6,166,367 A | 12/2000 | Cho |
| 6,188,975 B1 | 2/2001 | Gay |
| 6,191,660 B1 | 2/2001 | Mar et al. |
| 6,202,044 B1 | 3/2001 | Tzori |
| 6,211,741 B1 | 4/2001 | Dalmia |
| 6,225,866 B1 | 5/2001 | Kubota et al. |
| 6,249,167 B1 | 6/2001 | Oguchi et al. |
| 6,263,302 B1 | 7/2001 | Hellestrand et al. |
| 6,272,646 B1 | 8/2001 | Rangasayee |
| 6,294,962 B1 | 9/2001 | Mar |
| 6,304,101 B1 | 10/2001 | Nishihara |
| 6,314,530 B1 | 11/2001 | Mann |
| 6,332,201 B1 | 12/2001 | Chin et al. |
| 6,338,109 B1 | 1/2002 | Snyder et al. |
| 6,356,862 B2 | 3/2002 | Bailey |
| 6,369,660 B1 | 4/2002 | Wei |
| 6,377,646 B1 | 4/2002 | Sha |
| 6,434,187 B1 | 8/2002 | Beard |
| 6,445,211 B1 | 9/2002 | Saripella |
| 6,460,172 B1 * | 10/2002 | Insenser Farre et al. ........ 716/17 |
| 6,507,214 B1 | 1/2003 | Snyder |
| 6,525,593 B1 | 2/2003 | Mar |
| 6,535,946 B1 | 3/2003 | Bryant et al. |
| 6,542,025 B1 | 4/2003 | Kutz et al. |
| 6,553,057 B1 | 4/2003 | Sha |
| 6,560,306 B1 | 5/2003 | Duffy |
| 6,563,391 B1 | 5/2003 | Mar |
| 6,567,426 B1 | 5/2003 | van Hook et al. |
| 6,575,373 B1 | 6/2003 | Nakano |
| 6,598,178 B1 | 7/2003 | Yee et al. |
| 6,601,236 B1 | 7/2003 | Curtis |
| 6,603,330 B1 | 8/2003 | Snyder |
| 6,604,179 B2 | 8/2003 | Volk et al. |
| 6,608,472 B1 | 8/2003 | Kutz et al. |
| 6,611,220 B1 | 8/2003 | Snyder |
| 6,611,276 B1 | 8/2003 | Muratori et al. |
| 6,614,320 B1 | 9/2003 | Sullam et al. |
| 6,664,978 B1 | 12/2003 | Kekic et al. |
| 6,667,642 B1 | 12/2003 | Moyal |
| 6,681,280 B1 | 1/2004 | Miyake et al. |
| 6,718,533 B1 | 4/2004 | Schneider et al. |
| 6,765,407 B1 | 7/2004 | Snyder |
| 6,771,552 B2 | 8/2004 | Fujisawa |
| 6,784,821 B1 | 8/2004 | Lee |
| 6,798,299 B1 | 9/2004 | Mar et al. |
| 6,823,282 B1 | 11/2004 | Snyder |
| 6,823,497 B2 | 11/2004 | Schubert et al. |
| 6,825,689 B1 | 11/2004 | Snyder |
| 6,854,067 B1 | 2/2005 | Kutz et al. |
| 6,859,884 B1 | 2/2005 | Sullam |
| 6,865,429 B1 | 3/2005 | Schneider et al. |
| 6,868,500 B1 | 3/2005 | Kutz et al. |
| 6,892,310 B1 | 5/2005 | Kutz et al. |
| 6,892,322 B1 | 5/2005 | Snyder |
| 6,898,703 B1 | 5/2005 | Ogami et al. |
| 6,901,563 B1 | 5/2005 | Ogami et al. |
| 6,910,126 B1 | 6/2005 | Mar et al. |
| 6,950,954 B1 | 9/2005 | Sullam et al. |
| 6,952,778 B1 | 10/2005 | Snyder |
| 6,957,242 B1 | 10/2005 | Snyder |
| 6,967,511 B1 | 11/2005 | Sullam |
| 6,981,090 B1 | 12/2005 | Kutz et al. |
| 6,996,799 B1 | 2/2006 | Cismas et al. |
| 7,005,933 B1 | 2/2006 | Shutt |
| 7,023,257 B1 | 4/2006 | Sullam |
| 7,055,035 B2 | 5/2006 | Allison et al. |
| 7,086,014 B1 | 8/2006 | Bartz et al. |
| 7,092,980 B1 | 8/2006 | Mar et al. |
| 7,103,108 B1 | 9/2006 | Beard |
| 7,127,630 B1 | 10/2006 | Snyder |
| 7,149,316 B1 | 12/2006 | Kutz et al. |
| 7,150,002 B1 | 12/2006 | Anderson et al. |
| 7,180,342 B1 | 2/2007 | Shutt et al. |
| 7,185,162 B1 | 2/2007 | Snyder |
| 7,185,321 B1 | 2/2007 | Roe et al. |
| 7,221,187 B1 | 5/2007 | Snyder et al. |
| 7,283,151 B2 | 10/2007 | Nihei et al. |
| 7,386,740 B2 | 6/2008 | Kutz et al. |
| 7,406,674 B1 | 7/2008 | Ogami et al. |
| 2002/0108006 A1* | 8/2002 | Snyder .......................... 710/100 |
| 2002/0121679 A1 | 9/2002 | Bazarjani et al. |
| 2002/0156998 A1 | 10/2002 | Casselman |
| 2004/0054821 A1 | 3/2004 | Warren et al. |

FOREIGN PATENT DOCUMENTS

| | | |
|---|---|---|
| EP | 368398 A1 | 5/1990 |
| EP | 0450863A2 A1 | 10/1991 |
| EP | 0499383A2 A1 | 8/1992 |
| EP | 0639816A2 A1 | 2/1995 |
| EP | 1170671A1 A1 | 1/2002 |
| EP | 1205848 A1 | 5/2002 |
| EP | 1191423A2 A1 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 9532478 A1 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

"PSoC Designer: Integrated Development Environment, Getting Started 25-Minute Tutorial Revision 1.0", Cypress MicroSystems, Inc., CMS10006A, Jul. 3, 2001. 25 pages.*

"PSoC Technology Complete Changes 8-Bit MCU System Design",Cypress MicroSystem, Inc.,retrieved from <http://www.archive.org/web/20010219005250/http://www.cypressmicro.com/t...>, Feb. 19, 2001. 21 pages.*

Cypress MicroSystem, Inc, "Cypress Customer Forums", retrieve from <http://www.cypress.com/forums/messageview.cfm?catid=3&thr...>, Feb. 21, 2001. One page.*

Cypress MicroSystem, Inc, "PsoC Designer: Integrated Development Environment User Guide", Cypress MicroSystem, Inc., Rev 1.18, Sep. 8, 2003. 181 pages.*
Hamblen, "Rapid Prototyping Using Field-Programmable Logic Devices", Jun. 2000, IEEE, pp. 29-37.*
Karayiannis et al., "Using XML for Representation and Visualization of Elaborated VHDL-AMS Models", Oct. 2000, IEEE, VHDL International Users Forum Fall Workshop, Proceedings, pp. 83-87.*
Texas Instruments "TMS320C6000 Optimizing Compiler User's Guide", Apr. 2001, Texas Instruments, chapters 1: pp. 1-7 and chapter 2: pp. 1-44.*
Miguel, "Implementation of an universal Boot Monitor for an ARM-based System", May 2000, TU Berlin, Germany, Thesis, chapter 4: pp. 53-100.*
Goodenough, F. "Analog Counterparts of FPGAS Ease System Design" Electronic Design, Penton Publishing, Cleveland, OH, US vol. 42, No. 21, Oct. 14, 1994; 10 pages.
Harbaum, T. et al. "Design of a Flexible Coprocessor Unit" Proceedings of the Euromicro Conference, XX XX, Sep. 1999; 10 pages.
USPTO U.S. Appl. No. 09/924,734: "Programmable Microcontroller (PSoC) Architecture (Mixed Analog/Digital)"; Snyder et al., filed on Aug. 7, 2001; 28 pages.
USPTO U.S. Appl. No. 09/909,045: "Digital Configurable Macro Architecture," Warren Snyder, filed on Jul. 18, 2001; 37 pages.
USPTO U.S. Appl. No. 09/909,109: "Configuring Digital Functions in a Digital Configurable Macro Architecture," Warren Snyder, filed on Jul. 18, 2001; 38 pages.
USPTO U.S. Appl. No. 09/909,047: "A Programmable Analog System Architecture," Monte Mar, filed on Jul. 18, 2001; 60 pages.
USPTO U.S. Appl. No. 09/930,021: "Programmable Methodology and Architecture for a Programmable Analog System"; Mar et al., filed on Aug. 14, 2001; 87 pages.
USPTO U.S. Appl. No. 09/969,311: "Method for Synchronizing and Resetting Clock Signals Supplied to Multiple Programmable Analog Blocks," Bert Sullam, filed on Oct. 1, 2001; 57 pages.
USPTO U.S. Appl. No. 09/875,599: "Method and Apparatus for Programming a Flash Memory," Warren Snyder, filed on Jun. 5, 2001; 23 pages.
USPTO U.S. Appl. No. 09/975,115: "In-System Chip Emulator Architecture," Snyder et al., filed on Oct. 10, 2001; 38 pages.
USPTO U.S. Appl. No. 09/953,423: "A Configurable Input/Output Interface for a Microcontroller," Warren Snyder, filed on Sep. 14, 2001; 28 pages.
USPTO U.S. Appl. No. 09/893,050: "Multiple Use of Microcontroller Pad," Kutz et al., filed on Jun. 26, 2001; 21 pages.
USPTO U.S. Appl. No. 09/929,891: "Programming Architecture for a Programmable Analog System," Mar et al., filed on Aug. 14, 2001; 82 pages.
USPTO U.S. Appl. No. 09/969,313: "Architecture for Synchronizing and Resetting Clock Signals Supplied to Multiple Analog Programmable Analog Blocks," Bert Sullam, filed on Oct. 1, 2001; 50 pages.
Hintz et al., "Microcontrollers", 1992, McGraw-Hill; 11 pages.
Ganapathy et al., "Hardware Emulation for Functional Verification of K5", Jun. 1996, 33rd Design Automation Conference Proceedings, Jun. 3-7, 1996; 4 pages
U.S. Appl. 60/243,708 "Advanced Programmable Microcontroller Device"; Snyder et al., filed on Oct. 26, 2000; 277 pages.
"Webster's Third New International Dictionary", 1996, G. & C. Merriam Company; 3 pages. (including pp. 1328-1329).
USPTO U.S. Appl. No. 09/957,084: "A Crystal-Less Oscillator with Trimmable Analog Current Control for Increased Stability," Mar et al., filed on Sep. 19, 2001; 28 pages.
USPTO U.S. Appl. No. 10/011,214: "Method and Circuit for Synchronizing a Write Operation between an On-Chip Microprocessor and an On-Chip Programmable Analog Device Operating at Different Frequencies," Sullam et al., filed on Oct. 25, 2001; 49 pages.
USPTO U.S. Appl. No. 09/972,319: "Method for Applying Instructions to Microprocessor in Test Mode," Warren Snyder, filed on Oct. 5, 2001; 31 pages.
USPTO U.S. Appl. No. 09/972,003: "Test Architecture for Microcontroller Providing for a Serial Communication Interface," Warren Snyder, filed on Oct. 5, 2001; 32 pages.

USPTO U.S. Appl. No. 09/972,133: "Method for Entering Circuit Test Mode," Warren Snyder, filed on Oct. 5, 2001; 30 pages.
USPTO U.S. Appl. No. 09/973,535: "Architecture for Decimation Algorithm," Warren Snyder, filed on Oct. 9, 2001; 26 pages.
USPTO U.S. Appl. No. 09/977,111: "A Frequency Doubler Circuit with Trimmable Current Control," Shutt et al., filed on Oct. 11, 2001; 35 pages.
USPTO U.S. Appl. No. 10/272,231: "Digital Configurable Macro Architecture," Warren Snyder, filed on Oct. 15, 2002; 36 pages.
USPTO U.S. Appl. No. 11/125,554: "A Method for a Efficient Supply to a Microcontroller," Kutz et al., filed on May 9, 2005; 1 page.
USPTO U.S. Appl. No. 09/855,868: "Protecting Access to Microcontroller Memory Blocks," Warren Snyder, filed on May 14, 2001; 28 pages.
USPTO U.S. Appl. No. 09/887,923: "Novel Method and System for Interacting between a Processor and a Power on Reset to Dynamically Control Power States in a Microcontroller," Kutz et al., filed on Jun. 22, 2001; 44 pages.
USPTO U.S. Appl. No. 10/000,383: "System and Method of Providing a Programmable Clock Architecture for an Advanced Microcontroller," Sullam et al., filed on Oct. 24, 2001; 34 pages.
USPTO U.S. Appl. No. 10/001,477: "Breakpoint Control in an In-Circuit Emulation System," Roe et al., filed on Nov. 1, 2001; 43 pages.
USPTO U.S. Appl. No. 10/004,197: "In-Circuit Emulator with Gatekeeper Based Halt Control," Nemecek et al., filed on Nov. 14, 2001; 47 pages.
USPTO U.S. Appl. No. 10/004,039: "In-Circuit Emulator with Gatekeeper for Watchdog Timer," Nemecek et al., filed on Nov. 14, 2001; 46 pages.
USPTO U.S. Appl. No. 10/002,217: "Conditional Branching in an In-Circuit Emulation System," Craig Nemecek, filed on Nov. 1, 2001; 43 pages.
USPTO U.S. Appl. No. 10/001,568: "Combined In-Circuit Emulator and Programmer," Nemecek et al., filed on Nov. 1, 2001; 47 pages.
USPTO U.S. Appl. No. 10/001,478: "In-Circuit Emulator and Pod Synchronized Boot," Nemecek et al., filed on Nov. 1, 2001; 44 pages.
USPTO U.S. Appl. No. 09/887,955: "Novel Power on Reset Circuit for Microcontroller," Kutz et al., filed on Jun. 22, 2001; 42 pages.
USPTO U.S. Appl. No. 09/826,397: "Method and Circuit for Allowing a Microprocessor to Change its Operating Frequency on-the-Fly," Bert Sullam, filed on Apr. 2, 2001; 24 pages.
USPTO U.S. Appl. No. 09/893,048: "A Microcontroller having an On-Chip High Gain Amplifier," Kutz et al., filed on Jun. 26, 2001; 22 pages.
USPTO U.S. Appl. No. 09/912,768: "A Microcontroller having a Dual Mode Relax Oscillator that is Trimmable," James Shutt; filed on Jul. 24, 2001; 33 pages.
USPTO U.S. Appl. No. 09/922,419: "A Power Supply Pump Circuit for a Microcontroller," Kutz et al., filed on Aug. 3, 2001; 38 pages.
USPTO U.S. Appl. No. 09/922,579: "A Method for a Efficient Supply to a Microcontroller," Kutz et al., filed on Aug. 3, 2001; 37 pages.
USPTO U.S. No. 09/923,461: "Non-Interfering Multiply-Mac (Multiply Accumulate) Circuit," Warren Snyder, filed on Aug. 6, 2001; 25 pages.
USPTO U.S. Appl. No. 09/935,454: "Method and Apparatus for Local and Global Power Management in a Programmable Analog Circuit," Monte Mar, filed on Aug. 22, 2001; 1 page.
"An Analog PPL-Based Clock and Data Recovery Circuit with High Input Jitter Tolerance," Sun, Reprinted from IEEE Journal of Solid-State Circuits, 1989; 4 pages.
"WP 3.5: An Integrated Time Reference," Blauschild, Digest of Technical Papers, 1994; 4 pages.
"Micropower CMOS Temperature Sensor with Digital Output," Bakker et al., IEEE Journal of Solid-State Circuits, 1996; 3 pages.
U.S. Appl. No. 09/964,991: "A Novel Band-Gap Circuit for Providing an Accurate Reference Voltage Compensated for Process State, Process Variations and Temperature," Kutz et al., filed on Sep. 26, 2001; 25 pages.
U.S. Appl. No. 09/842,966: "Precision Crystal Oscillator Circuit Used in Microcontroller," Monte Mar, filed on Apr. 25, 2001; 28 pages.

U.S. Appl. No. 09/943,062: "Apparatus and Method for Programmable Power Management in a Prorammable Analog Circuit Block," Monte Mar, filed on Aug. 29, 2001; 46 pages.

U.S. Appl. No. 10/238,966: "Method for Parmeterizing a User Module," Perrin et al., filed on Sep. 9, 2002; 41 pages.

U.S. Appl. No. 09/207,912: "Circuit(s), Architecture and Method(s) for Operating and/or Tuning a Ring Oscillator," Monte Mar, filed on Dec. 9, 1998; 23 pages.

* cited by examiner

Figure 9

```
;
; Interrupt Vector Table
;
; Interrupt vector table entries are 4 bytes long and contain the code
; that services the interrupt (or causes it to be serviced).
;
  AREA  TOP(ROM, ABS)

org 0              ; Reset Interrupt Vector
  jmp__start         ; First instruction executed following a Reset org 04h            ; Supply Monitor Interrupt Vector
  `@INTERRUPT_1`
  reti org 08h            ; PSoC Block DBA00 Interrupt Vector
  `@INTERRUPT_2`
  reti
```

```
LoadConfigTBL_demo_0_Bank0:
; Global Register values
        db      60h, 28h        ; AnalogColumnInputSelect register
        db      63h, 05h        ; AnalogReferenceControl register
        db      65h, 00h        ; AnalogSyncControl register
        db      e6h, 00h        ; DecimatorControl register
        db      02h, 03h        ; Port_0_Bypass register
        db      06h, 00h        ; Port_1_Bypass register
        db      0ah, 00h        ; Port_2_Bypass register
        db      0eh, 00h        ; Port_3_Bypass register
        db      12h, 00h        ; Port_4_Bypass register
        db      16h, 00h        ; Port_5_Bypass register
; Instance name Counter8_1, User Module Counter8
;   Instance name Counter8_1, Block Name CNTR8(DBA02)
        db      2bh, 00h        ;Counter8_1_CONTROL_REG
        db      29h, 0ch        ;Counter8_1_PERIOD_REG
        db      2ah, 04h        ;Counter8_1_COMPARE_REG
        db      ffh
```

```
; THEORY of OPERATION:
;        Write data into the Period register.
;
;-----------------------------------------------------
Counter8_1_WritePeriod:
_Counter8_1_WritePeriod:
    mov  REG[Counter8_1_PERIOD_REG], A
    ret
```

Figure 15

```
;------------------------
; Registers used by counter8
;------------------------

Counter8_1_CONTROL_REG:   equ   2bh   ;Control register
Counter8_1_COUNTER_REG:   equ   28h   ;Counter register
Counter8_1_PERIOD_REG :   equ   29h   ;Period value register
Counter8_1_COMPARE_REG:   equ   2ah   ;CompareValue register
Counter8_1_FUNC_REG  :    equ   28h   ;Function register
Counter8_1_INPUT_REG :    equ   29h   ;Input register
Counter8_1_OUTPUT_REG :   equ   2ah   ;Output register ; end of file
```

Figure 16

```
/************************************************************
* Prototypes of Counter8 API. For a definition of
* functions see Counter8_1.inc.
************************************************************/
extern void  Counter8_1_EnableInt(void);
extern void  Counter8_1_DisableInt(void);
extern void  Counter8_1_Start(void);
extern void  Counter8_1_Stop(void);
extern void  Counter8_1_WritePeriod(BYTE bPeriod);
extern void  Counter8_1_WriteCompareValue(BYTE bCompareValue);
extern BYTE bCounter8_1_ReadCompareValue(void);
extern BYTE bCounter8_1_ReadCounter(void);
```

SYSTEM PROVIDING AUTOMATIC SOURCE CODE GENERATION FOR PERSONALIZATION AND PARAMETERIZATION OF USER MODULES

RELATED APPLICATIONS

U.S. patent application entitled, "Microcontroller Programmable System on a Chip," application Ser. No. 10/033,027, filed on Oct. 22, 2001, inventor Warren Snyder, is hereby incorporated herein by reference.

BACKGROUND OF THE INVENTION

1. Field of the Invention

The present invention relates to the field of programming and configuring programmable electronic devices. More particularly, the present invention relates to using a design system for (i) displaying choices for user-selected functions; (2) displaying choices for where and how to implement the selected function; and (3) automatically generating computer code, that when executed, will configure the electronic device to perform the selected function.

2. Related Art

A microcontroller is an integrated circuit device ("chip") composed of functional units or "blocks," input/output pins, internal busses and programmable interconnections among these components. Many of these configurable components can be programmed to perform a specific function or connect to another specific sub-system by loading a particular bit pattern into a particular register in the actual chip. Recently, a microcontroller having programmable analog and digital blocks has been introduced.

In addition, a microcontroller also has a central processing unit ("CPU") and a memory system for storing data and instructions. The CPU and the memory system can interact with a programmable block, e.g., a configurable component, by reading and writing registers associated with that component. The configurable blocks are therefore programmed by setting their configuration registers with certain values. Thus, by writing a program for the CPU, a user can specify the function the configurable component will perform as well as the connections among configurable components. The user can also write programs that interact with the configurable components once those components have been initialized. The programs also do this by reading and writing registers associated with the configurable components.

Configuring and programming a microcontroller requires specifying and setting an enormous number of bits. It is common for engineers who need to configure and program a microcontroller to develop and use software for that purpose such as design tools, databases, assemblers, compilers, linkers, and debuggers. However, conventional microcontroller programming and configuring requires that the engineer incorporate the literal binary codes and addresses associated with the configurable components into the microcontroller source code.

This conventional technique therefore requires many manual steps and is error-prone and tedious. In other words, if a designer wants to program a configurable block to implement a circuit, then the designer manually determines the configuration registers of the hardware resource. The circuit designer then manually develops code to program those registers in such a way to realize the circuit (e.g., an amplifier). The designer then has to manually write code to operate the circuit in the desired fashion, e.g., give the amplifier a specific gain, etc. When dealing with physical addresses of configuration registers and the specific configuration data needed to program them, the data and information are often expressed as a series of numbers in decimal and/or hexadecimal and/or binary formats. Unfortunately, these numbers and number formats are very complex and hard to read and remember. Any small error in syntax, or a typographical error, or a transposition error can be fatal for the overall program. Manual programming and mapping leads to such errors.

SUMMARY OF THE INVENTION

Accordingly, what is needed is a design system for automatically generating source code that incorporates configuration information for the programming of hardware resources to implement and program circuits. What is needed is such a system that can be used to program programmable electronic devices, e.g., microcontrollers. What is needed yet is a system and method for automatically generating source code to program hardware resources once a designer selects a desired circuit design and a hardware resource to implement that circuit design. The present invention provides these advantages and others not specifically mentioned above but described in sections to follow.

A method and system of automatically generating assembly code (or other source code) for configuring a programmable microcontroller are presented. Source code files are automatically generated for: (1) realizing the user module in a hardware resource; and also (2) to configure the user module to behave in a prescribed manner.

The method involves displaying virtual blocks in a computerized design system where the virtual blocks correspond to programmable circuit blocks in a programmable electronic device, e.g., a microcontroller chip. The user selects a user module (e.g., a circuit design) that defines a particular function to be performed on the microcontroller. The user module is represented, in part, by XML data which defines the way in which configuration registers need to be programmed in order to implement the circuit design thereon. The user then assigns or allocates virtual blocks to the user module, e.g., "placement of the user module." The programmable hardware resources include both programmable analog blocks and programmable digital blocks. A user module may span multiple blocks. The hardware resources are also represented, in part, by XML data defining the physical addresses of the configuration registers.

The design system then automatically generates source code for configuring the programmable blocks to perform the desired function. This process involves a mapping of the XML data from the user module and from the selected hardware resources. The source code can then be assembled, linked and loaded into the microcontroller's memory system. When executed on the microcontroller, the executable code will then set configuration registers within the blocks to implement the function.

Two different types of configuration are discussed herein with respect to the user module. Automatic generation of source code for "personalization" of a user module is the process (performed by embodiments of the present invention) of generating source code that sets configuration registers to implement or "realize" the circuit design in the hardware resource, e.g., to implement an amplifier circuit. On the other hand, automatic generation of source code for "parameterization" of a user module is the process (performed by embodiments of the present invention) of generating source code that sets configuration registers to cause an already implemented circuit design to behave in particular way, or to adopt some characteristic, e.g., to program the amplifier with a particular gain, etc., or to make some clocked digital circuit level sensitive or edge sensitive, etc.

More specifically, an embodiment of the present invention is directed to a method (and computer system) for generating assembly code to configure a microcontroller with programmable circuit blocks, the method comprising: displaying a collection of virtual blocks in a design system with each virtual block in the collection corresponding to a programmable block in the microcontroller; selecting a user module defining a function; assigning a virtual block taken from the collection to the user module; and automatically constructing a source code table file comprising configuration information for a programmable block of the microcontroller corresponding to the virtual block wherein the configuration information is used to cause the programmable block to implement the function.

Embodiments include the above and wherein the function can be a timer, a counter, an analog-to-digital converter, a digital-to-analog converter, a pulse-width modulator, a signal amplifier, or a serial communication unit.

Embodiments include the above and wherein the design system computes a register address for the programmable block corresponding to the virtual block assigned to the user module, devising a symbolic name for that register address and placing the symbolic name into a table file, an include file or an assembly code file.

BRIEF DESCRIPTION OF THE DRAWINGS

FIG. 9 shows a portion of a template file with a generic name in accordance with an embodiment of the present invention.

FIG. 13 shows a portion of an assembly code table file in accordance with an embodiment of the present invention.

FIG. 14 shows the use of a symbolic name as a register address in assembly code in accordance with an embodiment of the present invention.

FIG. 15 shows a portion of an assembly include file defining the symbolic name in accordance with an embodiment of the present invention.

FIG. 16 shows a portion of a generated exemplary C-header file defining procedural interfaces for managing a counter in accordance with an embodiment of the present invention.

DETAILED DESCRIPTION OF THE INVENTION

Figure 1:
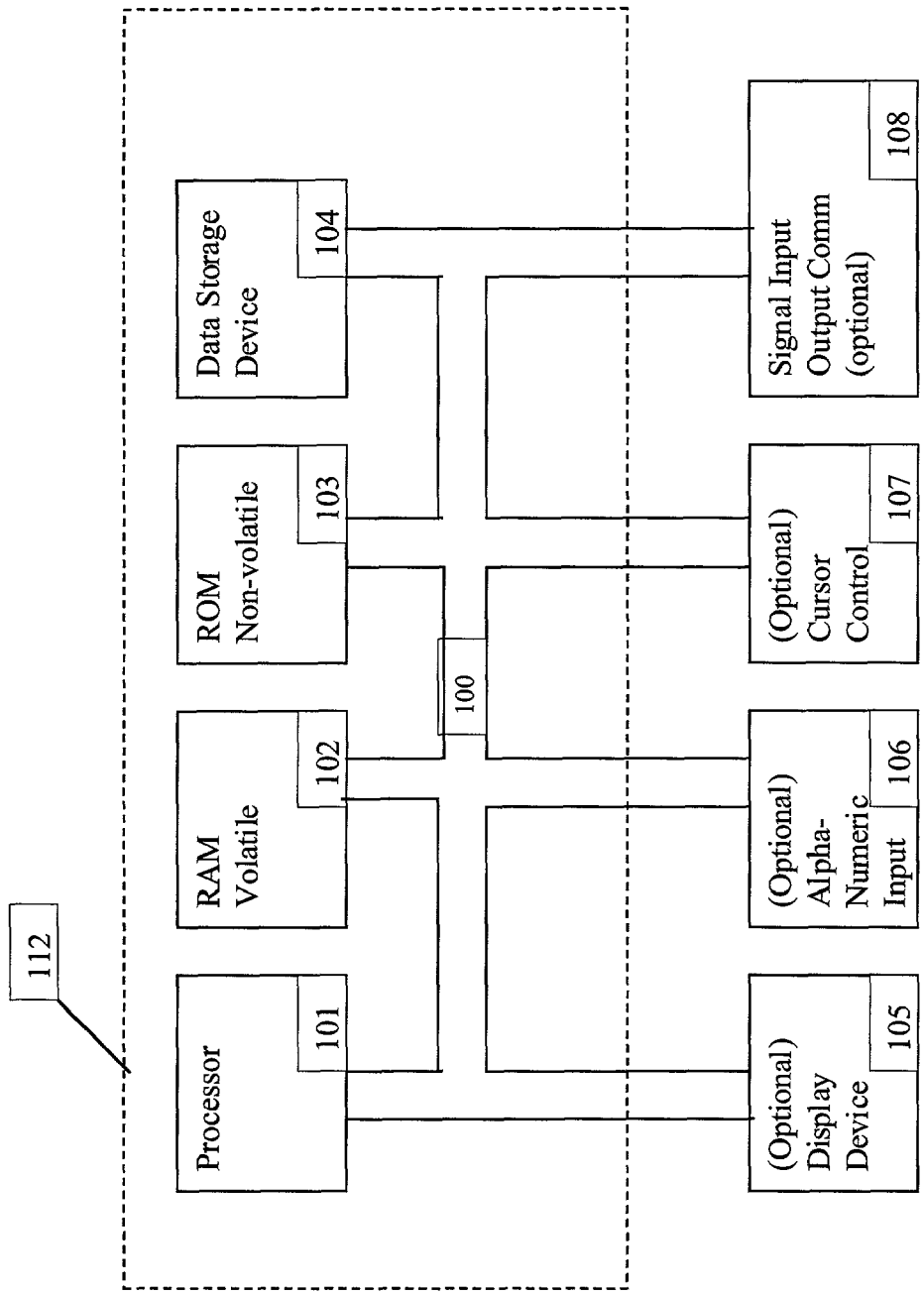
FIG. 1 is a general purpose computer system on which embodiments of the present invention may be implemented.

In the following detailed description of the present invention, a design system providing automatic source code generation for personalization and parameterization of user modules, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

Notation and Nomenclature

Some portions of the detailed descriptions that follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those utilizing physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "checking," "comparing," "accessing," "processing," "computing," "suspending," "resuming," "translating," "calculating," "determining," "scrolling," "displaying," "recognizing," "executing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Computer System 112

Aspects of the present invention, a design system for automatically generating assembly code to configure a microcontroller, are discussed in terms of steps executed on a computer system. Although a variety of different computer systems can be used with the present invention, an exemplary computer system 112 is shown in FIG. 1.

Exemplary computer system 112 comprises an address/data bus 100 for communicating information, a central processor 101 coupled with the bus for processing information and instructions, a volatile memory 102 (e.g., random access memory) coupled with the bus 100 for storing information and instructions for the central processor 101 and a non-volatile memory 103 (e.g., read only memory) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user.

Also included in computer system 112 is an alphanumeric input device 106 including alphanumeric and function keys coupled to the bus 100 for communicating information and command selections to the central processor 101. Generally, alphanumeric input device 106 is called a keyboard or keypad. System 112 also includes a cursor control or directing device 107 coupled to the bus for communicating user input information and command selections to the central processor 101. Within the context of the present invention, the cursor directing device 107 can include a number of implementations including a mouse device, for example, a trackball device, a joystick, a finger pad (track pad), an electronic stylus, an optical beam directing device with optical receiver pad, an optical tracking device able to track the movement of a user's finger, etc., or any other device having a primary purpose of moving a displayed cursor across a display screen based on user displacements.

Computer system 112 of FIG. 1 can also include an optional signal generating device 108 coupled to the bus 100 for interfacing with other networked computer systems, e.g., over the Internet. The display device 105 of FIG. 1 utilized with the computer system 112 of the present invention may be a liquid crystal device, other flat panel display, cathode ray tube, or other display device suitable for creating graphic images and alphanumeric characters recognizable to the user.

Design System Providing Automatic Source Code Generation for Personalization and Parameterization of User Modules in Accordance with Embodiments of the Present Invention In a preferred embodiment, a computer implemented design system provides the capability of automatically generating source code that, when compiled or assembled, linked and loaded, initializes, specifies and controls configurable elements within a programmable electronic device, e.g., a microcontroller to perform a user-selected function.

In a preferred embodiment of a microcontroller, some of the configurable elements are grouped into programmable blocks ("blocks"). The blocks can be grouped into families. Every block in the same family is substantially analogous. In a preferred embodiment, there is a family of blocks supporting analog functions and a family of blocks supporting digital functions. Each block has one or more registers. Each block can be programmed to perform different functions and connect to other blocks by specifying values for each configuration register in the block. This initial specification of the components is typically performed as soon as the microcontroller "boots-up". This is referred to as "personalization" of the microcontroller to realize a user module design in selected hardware resources. In addition, a block can be configured to have registers that are used to adjust, control or measure the performance of the personalized block. This is referred to as "parameterization."

US patent application entitled, "Microcontroller Programmable System on a Chip," having Ser. No. 10/033,027, filed on Oct. 22, 2001, inventor Warren Snyder, is hereby incorporated herein by reference and describes such a programmable microcontroller.

Figure 2:
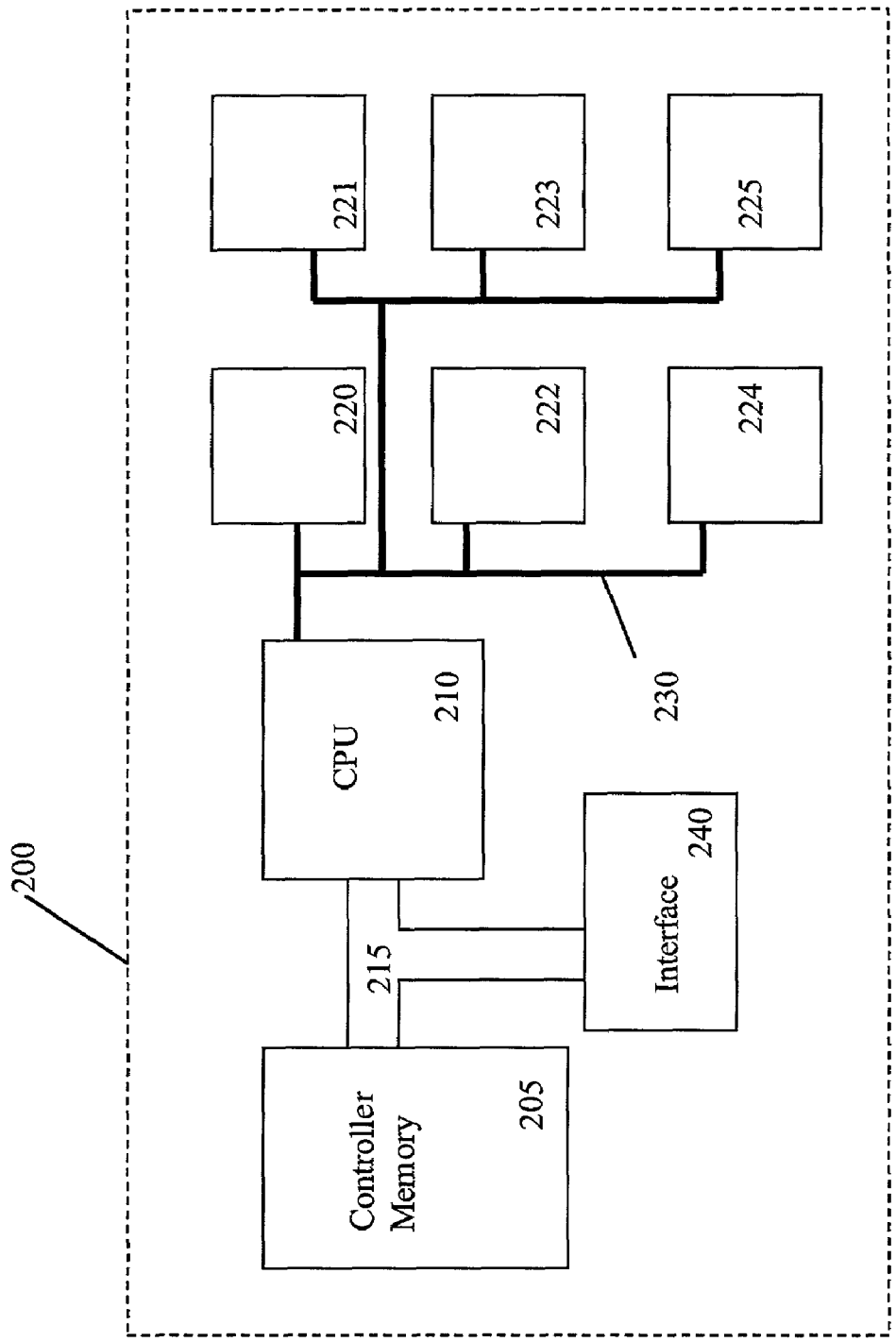
FIG. 2 illustrates the general architecture of a microcontroller with programmable blocks in accordance with an embodiment of the present invention.

FIG. 2 shows a generic architecture of a microcontroller 200 with a family of programmable blocks 220, 221, 222, 223, 224, 225, also called "hardware resources." The microcontroller 200 has a microcontroller CPU 210 connected to a controller memory system 205 via a bus 215. The bus 215 also allows data from outside of microcontroller 200 to come into the controller memory system 205 via interface 240. The microcontroller CPU 210 defines the function performed by each block by setting the contents of configuration registers associated within each block by control bus 230. Control bus 230 may include logic. Each configuration register in the microcontroller has a distinct physical register address. By executing a "load register" instruction from controller memory system 205 register with a register address for a particular block, that block will be configured in accordance with the contents loaded. In some cases, to completely configure a block or to interconnect that block to other resources in the microcontroller 200, it may be necessary to load several configuration registers. The configuration registers may be located in a separate memory space within the microcontroller 200.

Figure 3:
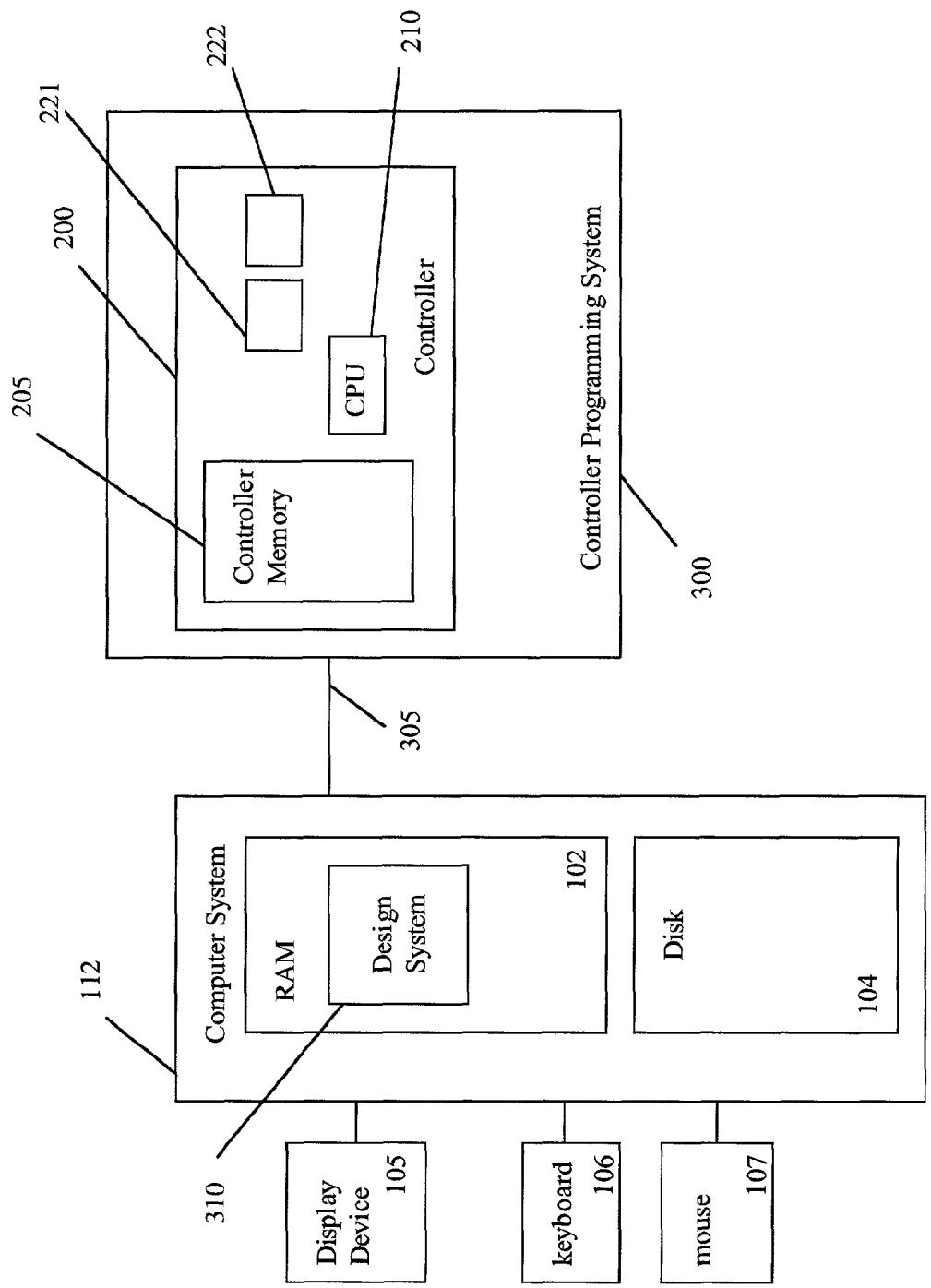
FIG. 3 illustrates the relationship between a microcontroller, a system for programming a microcontroller, and a computer system for running a design system in accordance with an embodiment of the present invention.

FIG. 3 shows the overall relationship of a design system 310 operating in a computer system 112 with a microcontroller 200 installed in controller programming system 300. The controller programming system 300 is connected to the computer system 112 by a communications link 305. Communications link 305 could be a serial line, a parallel line, a network connection or other comparable inter-computer communication mechanism. Controller programming system 300 could include in-circuit emulation capabilities. It is appreciated that the design system 310 can be used without the microcontroller 200 attached thereto in order to determine the information required to program the chip. However, when the final image is determined and it is time to program the device, the microcontroller needs to be attached to the programming device.

In general, the design system 310 models the actual configurable elements and blocks found in microcontroller 200 with corresponding virtual elements and blocks. In the discussion that follows, the term "block" as used in context of a design system means "virtual block," while the same term used in the context of a microcontroller means an actual block or "hardware resource."

Figure 4:
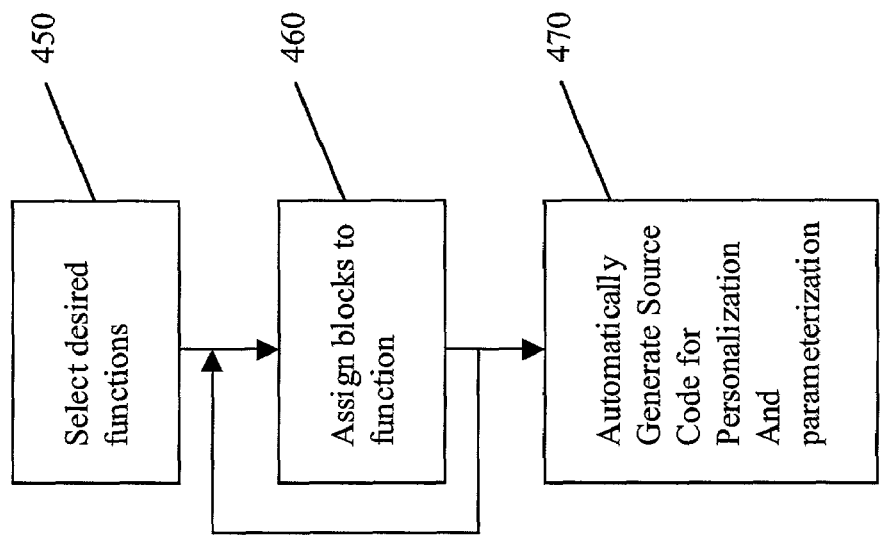
FIG. 4 is a flow chart of steps of using a design system to automatically generate code in accordance with an embodiment of the present invention.

FIG. 4 shows a computer implemented flow chart for using a design system to automatically generate source code for both parameterization and personalization of a user module. In step 450, the user selects the desired functions in the form of user modules. Generally, a user module can be viewed as an integrated circuit design, e.g., an amplifier, a counter, a timer, a modem, etc. The user can select multiple instances of the same type of user module. In step 460, the user assigns blocks to a user module, e.g., "places" the user module. This step is repeated for each user module selected in step 450. In step 470, after assigning blocks, the design system then can automatically generate the assembly code for configuring the actual blocks.

More specifically, a user module is the collection of information necessary to implement a particular function using one or more generic blocks. This would include the specific values that need to be loaded into a block's registers to implement the circuit design. The design system can load the information about user modules from a file when the design system is initialized. In one embodiment, the information necessary to represent a user module is formatted using XML data.

Figure 5:
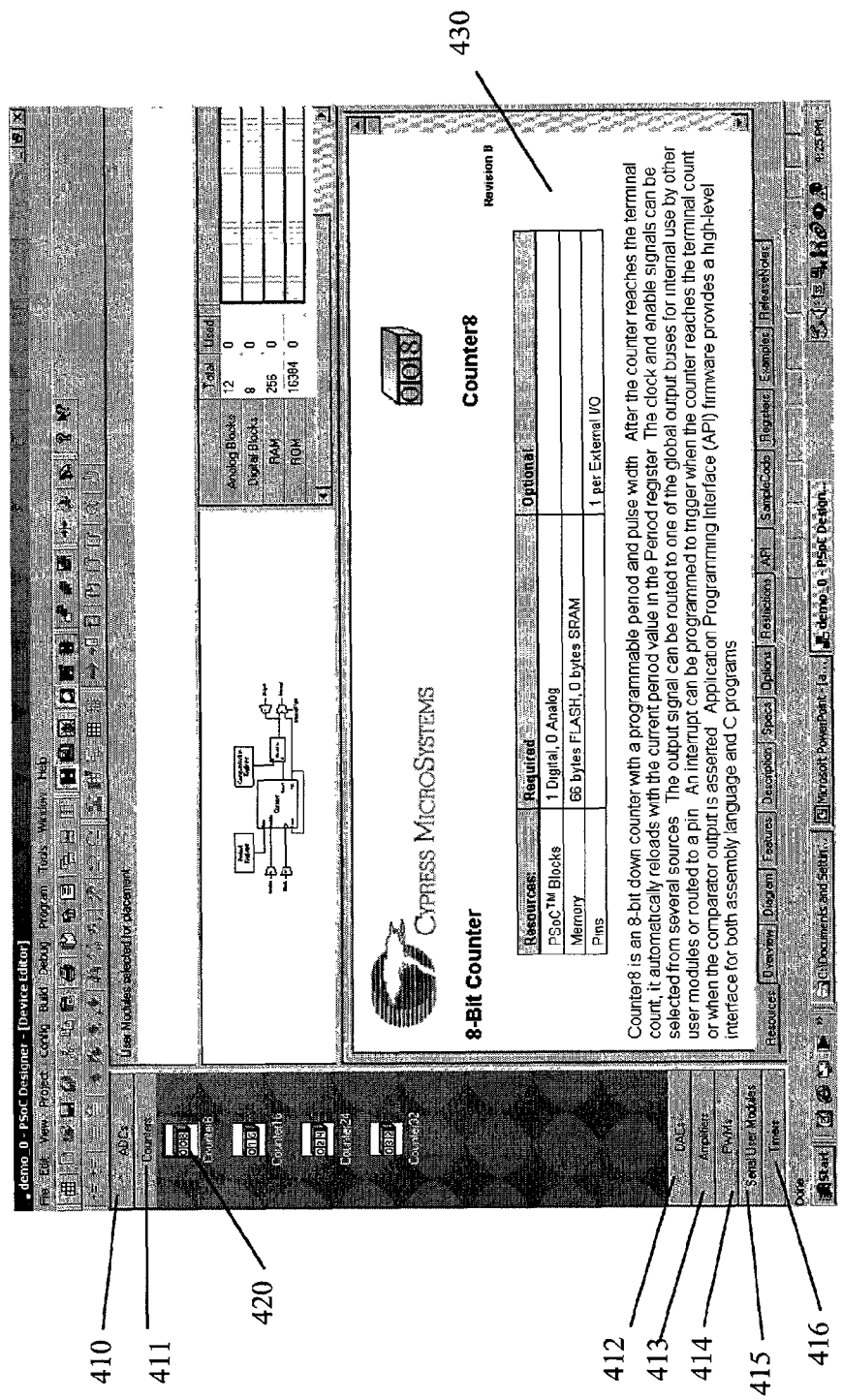
FIG. 5 is a screen display showing the user module choices in accordance with an embodiment of the present invention.

FIG. 5 shows an exemplary screen display from a design system to allow the user to select user modules. The user modules are grouped according to function. In a preferred embodiment, the functions can include, for example, analog-to-digital converters 410, counters 411, digital to analog converters 412, amplifiers 413, pulse width modulators 414, serial communication units 415, and timers 416, etc. Almost any circuit design can be represented as a user module. The functions can also come in different sizes or capabilities, such as 8-bit counters or 16-bit counters, etc. An 8-bit counter user module 420 is being examined. A data sheet 430 describing the details of the examined user module is also displayed. The user can double click on the icon for examined user module to add it to a collection of selected user modules.

Figure 6:
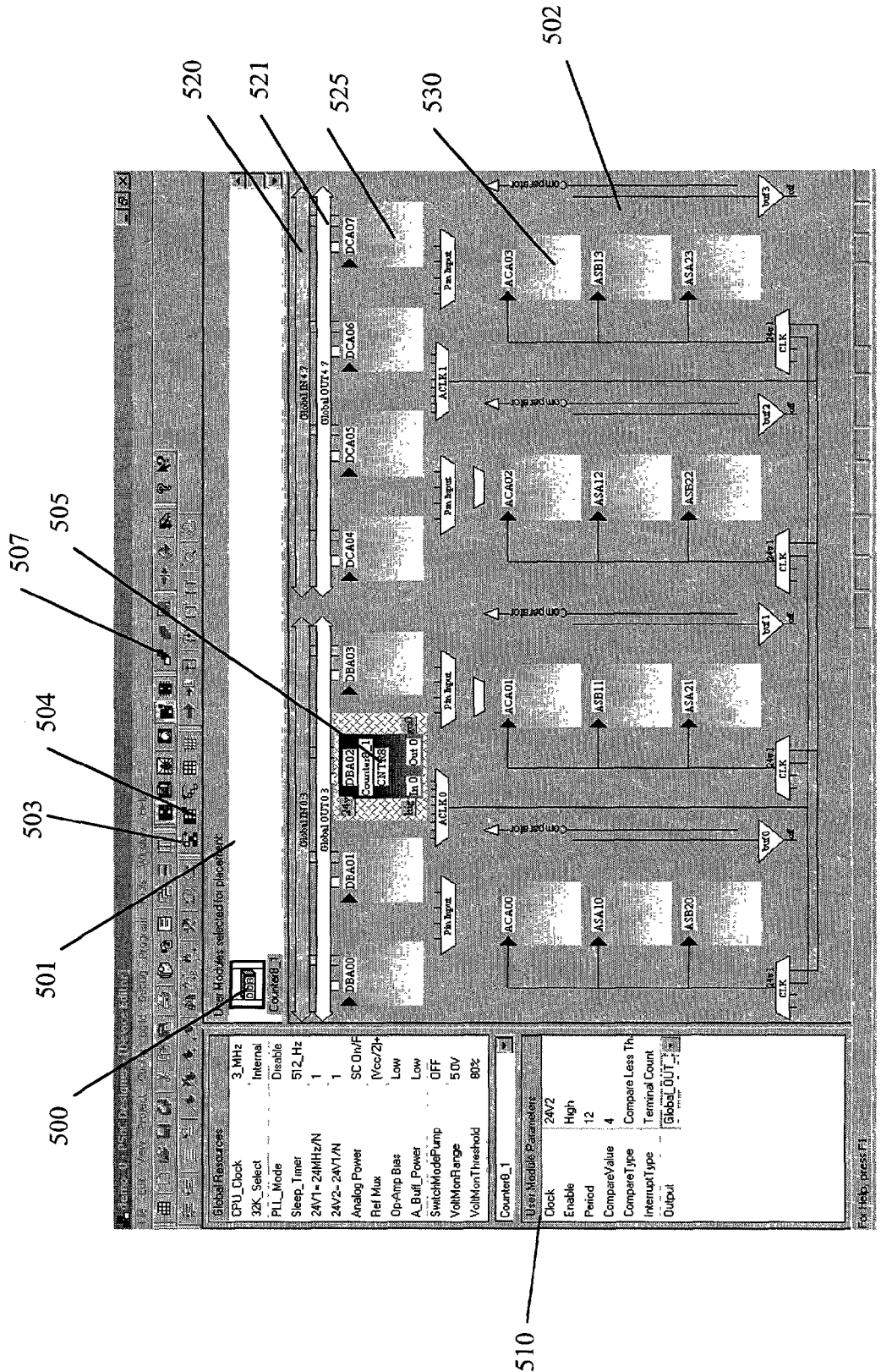
FIG. 6 is a screen display showing the assignment of a virtual block to a user module in accordance with an embodiment of the present invention.

FIG. 6 shows an exemplary screen display from the design system for managing step 460. The collection of selected user modules selected is displayed in window 501. A second window 502 displays the available virtual blocks and other configurable elements. In one embodiment, there are analog blocks 530 and digital blocks 525, input bus 520, and output bus 521. The user places the user module (or, equivalently, assigns blocks to a particular user module) by choosing a specific user module 500 from the collection of selected user modules, and then pushing an advance placement button 503 to move through different candidate placements. Once a desired placement is found, the user then pushes a commit button 504. In this example, the user module only requires one digital block, which has been assigned to a specific virtual block 505. In some cases, a user module will require multiple blocks. A user module may use more than one block and may use both digital and analog blocks. Parameter window 510 displays additional user-specifiable information about the selected user module 500. It is appreciated that this information is used for parameterization of the user module. After assigning virtual blocks to all selected user modules, the user then presses a generate code button 507 to generate files in step 470.

Figure 7:
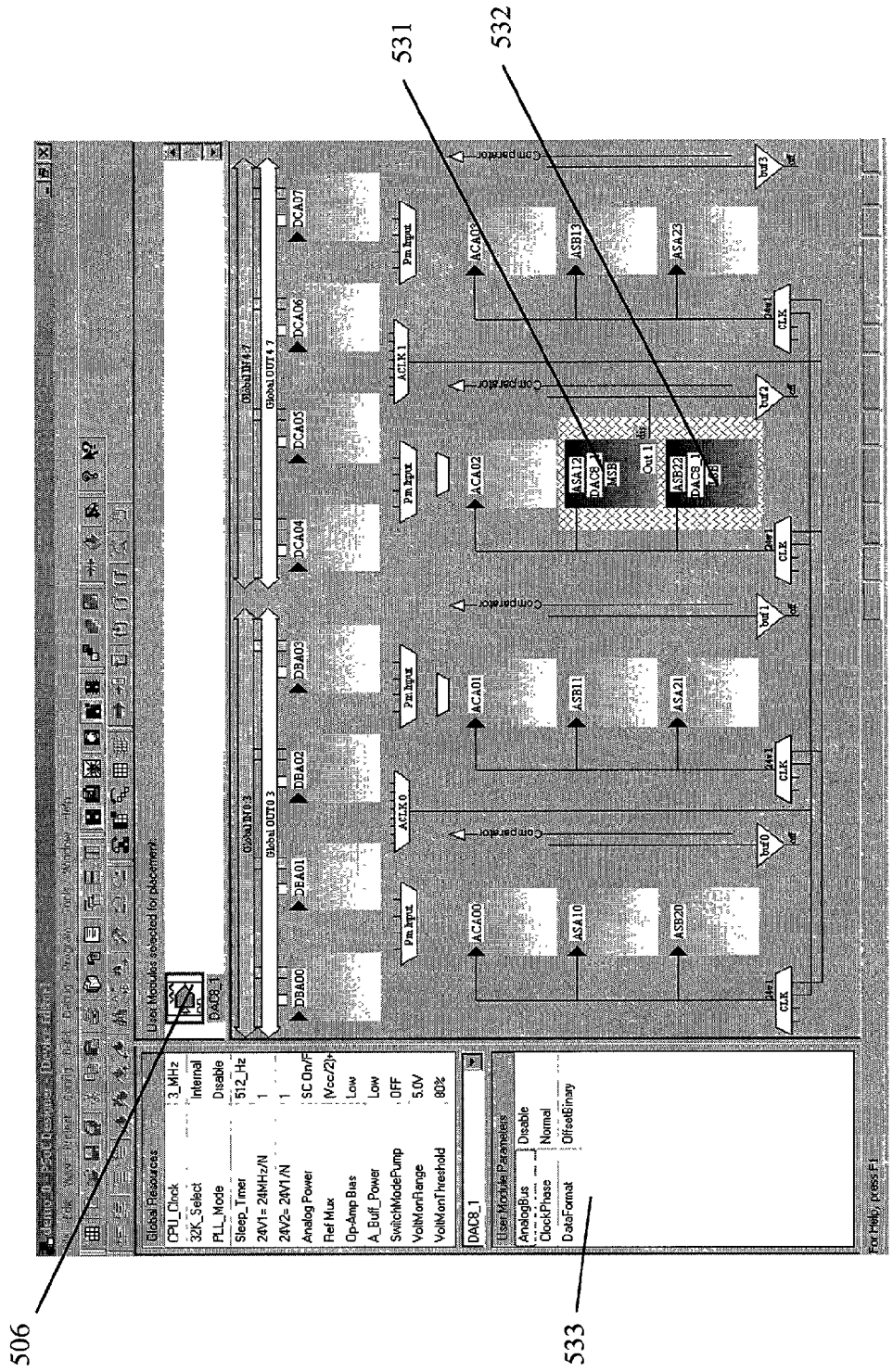
FIG. 7 is a screen display showing the assignment of two virtual blocks to a user module in accordance with an embodiment of the present invention.

FIG. 7 shows a screen display for a situation in which a user module uses more than one block (e.g., analog blocks 531 and 532) and is shown for a selected digital-to-analog converter 506. Parameter window 533 displays additional user-specifiable information about the selected user module 506. It is appreciated that this information is used for parameterization of the user module.

Figure 8A:
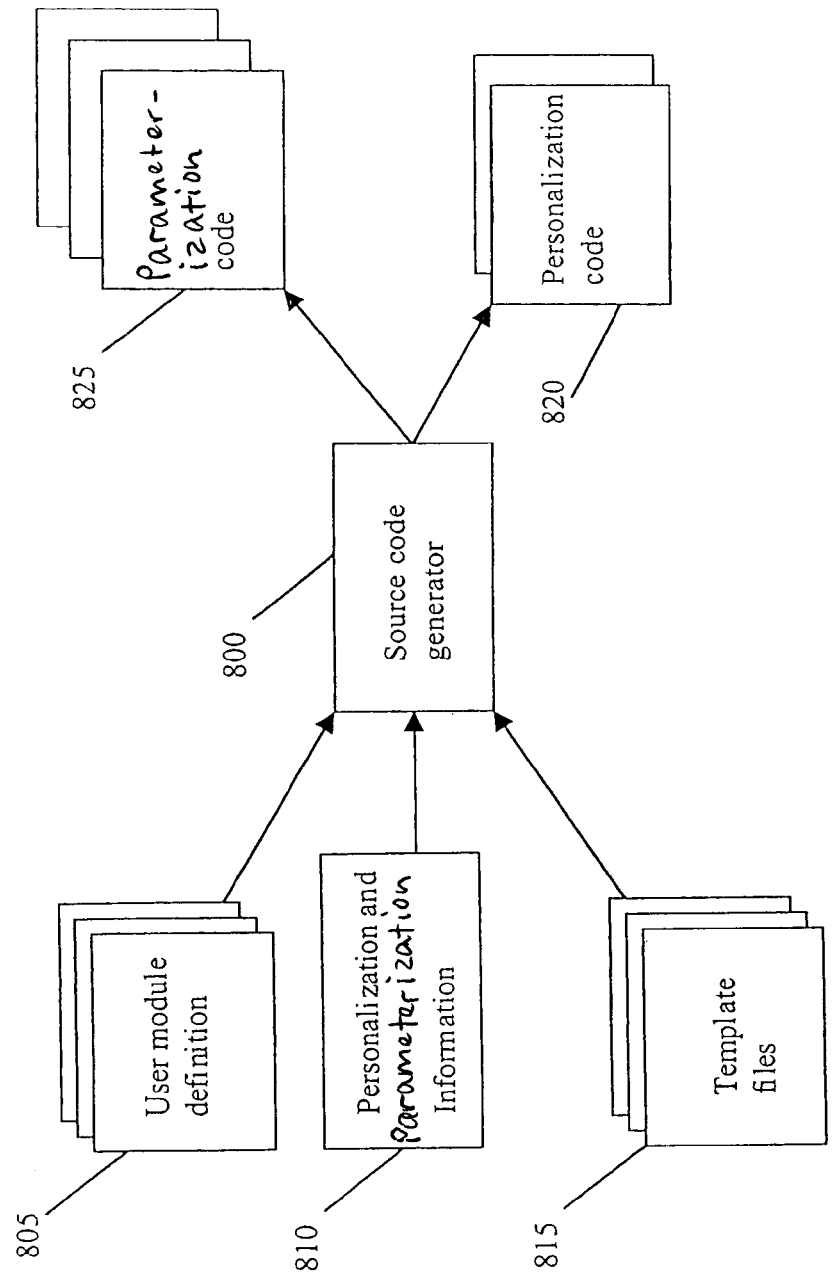
FIG. 8A is a data flow diagram showing the flow of information through the source generation process.

FIG. 8A shows the flow of information used in generating code in step 470. The code generation module 800 implements step 470. It obtains the details of how to generally configure a particular block to perform a specific function from user module definitions 805. The code generation module 800 obtains information about which virtual block to use for which user module and specific settings within a user module from the personalization and parameterization information 810 that is provided from the graphical user interface in the design system. The template files 815 are used to provide a starting point for building the code. Symbolic names derived from the user module definition 805 and the personalization and parameterization information 810 are substituted for generic names in copies of the template files 815. The code generation module 800 constructs source code files for personalizing the micro-controller 820 and source code files for parameterizing the micro-controller 825.

Figure 8B:
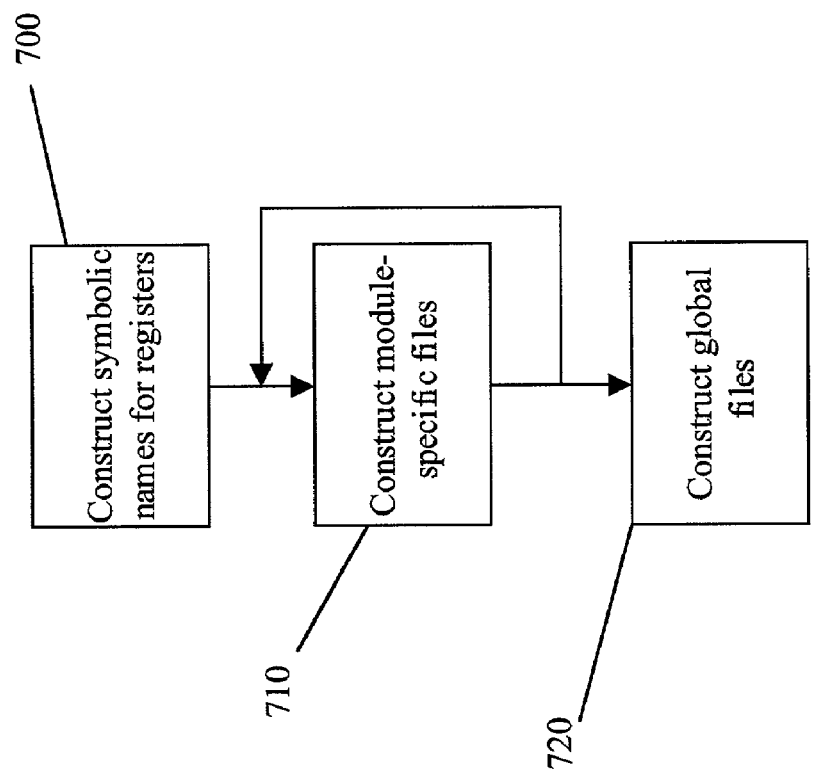
FIG. 8B is a flow chart showing the construction of source code files in accordance with an embodiment of the present invention.

FIG. 8B shows a computer implemented flow chart providing more details for step 470. In step 700, the design system defines symbolic names for the register addresses for the assigned blocks in step 460. Symbolic names are also derived for the addresses of the various assembly routines that will be used to configure the actual blocks to implement the selected user modules. In one embodiment, the symbolic name is derived from the type of user module, the instance name, and the function associated with that register or routine. The register address for a particular function for a particular instance of a user module is determined from the block assigned to that instance of the user module and the register within a generic block specified by the user module for that particular function.

In step 710, one or more assembly code files are generated for each instance of a user module. Each file is constructed from a data file, e.g, a template file, by substituting the symbolic names constructed in step 700 for generic names in the template file. A sample portion of a template file is shown in FIG. 9 with a generic name 633.

In step 720, one or more assembly code files are generated that refer to all of the user modules ("global files"). These can include assembly code table files, include files, header files, as well as interrupt service routine code. These files can also be generated from a template file.

Figure 10:
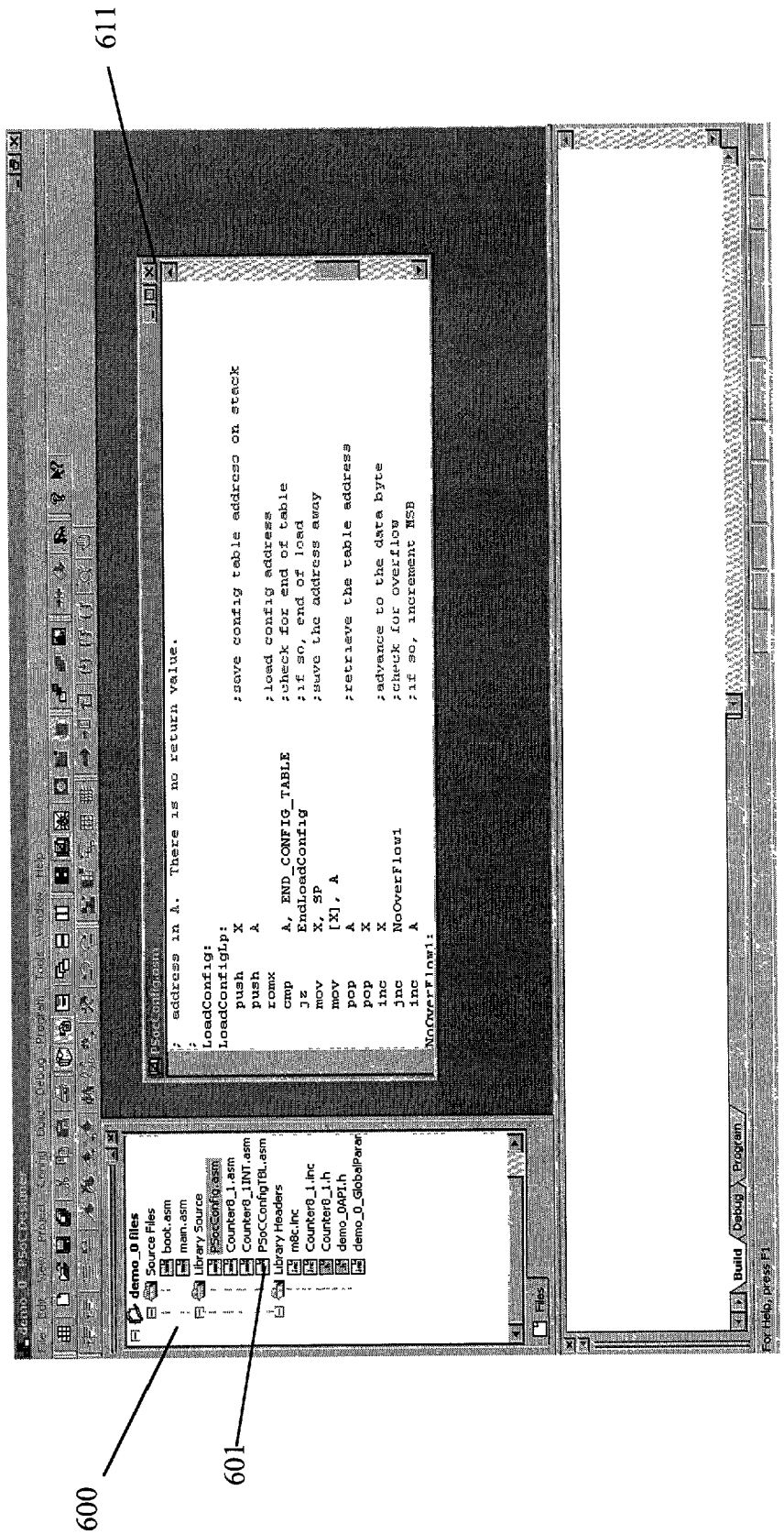
FIG. 10 is a screen display showing a generated assembly code file in accordance with an embodiment of the present invention.

FIG. 10 shows a screen display with a window 600 showing the various generated files. Window 611 displays the contents of a selected file 601.

Figure 11:
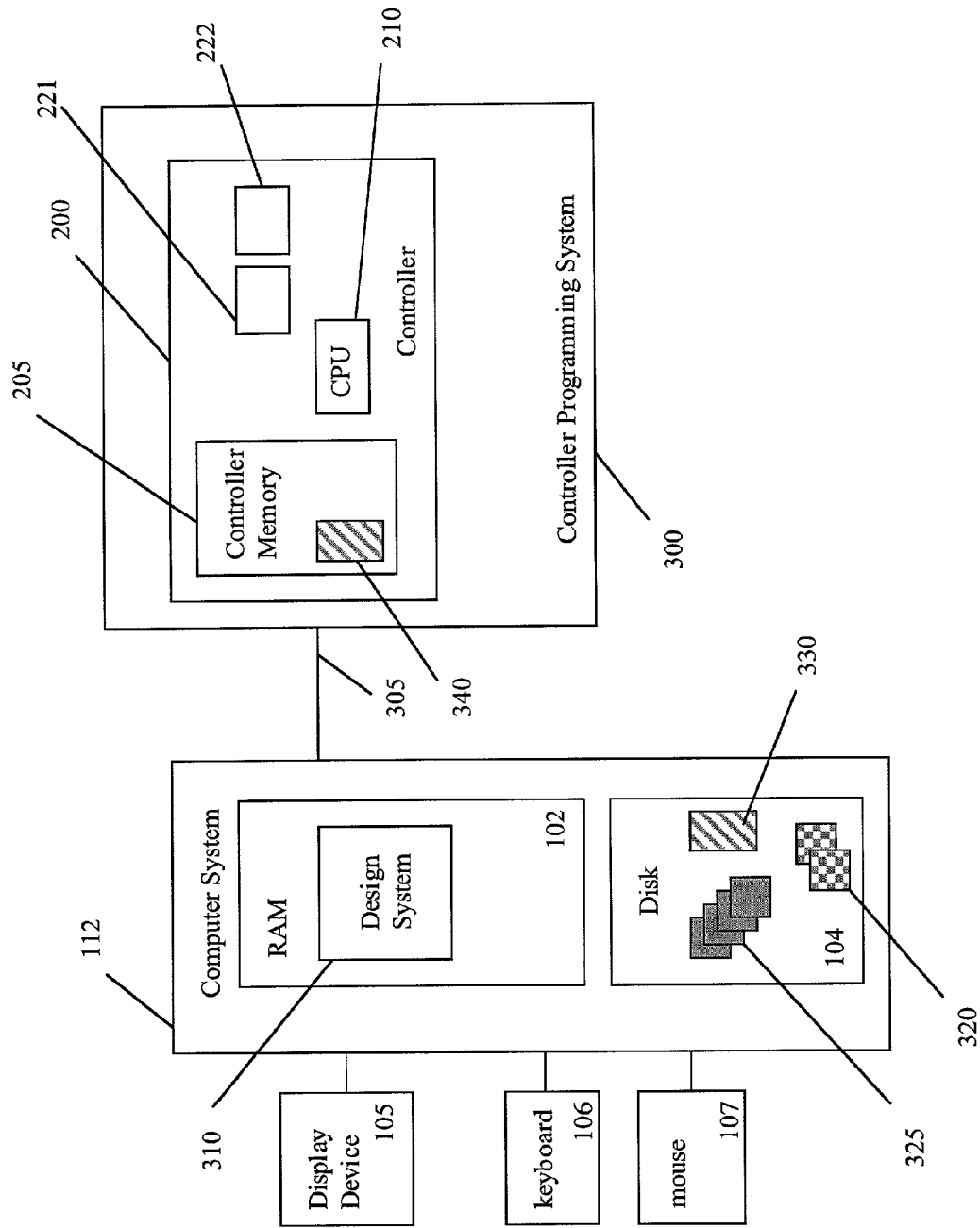
FIG. 11 illustrates the relationship of different code files to the design system and a microcontroller in accordance with an embodiment of the present invention.
Figure 12:
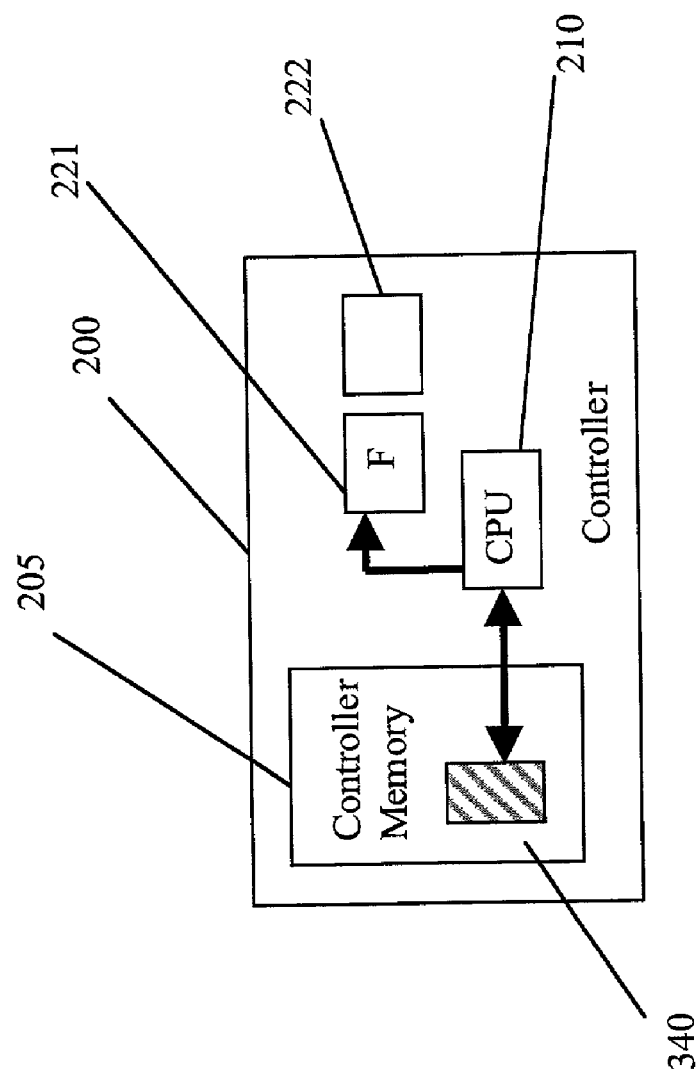
FIG. 12 illustrates the relationship of an executing program to the programmable blocks in accordance with an embodiment of the present invention.

FIG. 11 shows the relationship of template files, assembly code files, executable code files, and downloaded code to the design system 310 operating on a computer system 112 and a controller programming system 300. In general terms, the design system will read template files 320, and produce assembly, include and header files 325. The design system will compile, assemble and link the files together to produce an executable file 330. The design system then can download the executable file 330 to the microcontroller programming system 300, which in turn places it in the microcontroller memory system 205 as downloaded code block 340. As shown in FIG. 12, the CPU 210 executes code block 340 to configure various programmable blocks 220, 221.

FIG. 13 shows a portion of a generated assembly code table file where the configuration contents of the various registers is placed. The symbolic name 632 associated with a register is in a comment.

FIG. 14 shows a portion of a generated assembly code file where the symbolic name is used to specify the register that is being loaded with a new value.

FIG. 15 shows a portion of a generated assembly include file that defines the values associated with the generated symbolic names.

FIG. 16 shows a portion of a generated C language header file. Generated header files would allow a user to develop code in C that could manipulate the various registers specified by the user.

The preferred embodiment of the present invention, a system and method for automatically generating assembly code to configure programmable elements of a microcontroller, is thus described. While the present invention has been described in particular embodiments, it should be appreciated that the present invention should not be construed as limited by such embodiments, but rather construed according to the below claims.

What is claimed is:

1. A method for configuring a microcontroller, said method comprising:
   displaying a first graphical user interface on a display device of a computer system, said first graphical user interface comprising a collection of virtual blocks in a design system;
   receiving at said computer system a selection of a user module, wherein said user module comprises information for implementing a function using a programmable physical block, and wherein said user module is represented by first markup language data that includes information defining how configuration registers for said microcontroller are to be programmed in order to implement said function, and wherein said programmable physical block is represented by second markup language data that includes information defining physical addresses of said configuration registers;
   displaying on said display device a second graphical user interface operable for receiving user-specifiable information about said user module;
   assigning a virtual block taken from said collection to said user module, wherein said virtual block corresponds to said programmable physical block; and
   constructing computer-generated source code, wherein constructing the computer-generated source code comprises:
      linking said first markup language data and said second markup language data;
      substituting said user-specifiable information comprising information specific to said user module, information specific to said function and information specific to a control parameter of said function for generic information in said template files to produce assembly, include and header files.

2. The method of claim 1, wherein said function comprises a pulse width modulator.

3. The method of claim 1, wherein said function comprises a timer.

4. The method of claim 1, wherein said function comprises an analog-to-digital converter.

5. The method of claim 1, wherein said function comprises a digital-to-analog converter.

6. The method of claim 1, wherein said function comprises a counter.

7. The method of claim 1, wherein said function comprises a signal amplifier.

8. The method of claim 1, wherein said function provides serial communication.

9. The method of claim 1, wherein said collection is displayed as a two dimensional array of programmable analog virtual blocks and programmable digital virtual blocks.

10. The method of claim 1, wherein said assigning further comprises assigning a second virtual block to said user module.

11. The method of claim 1, wherein said source code comprises a symbolic name for a register address in said programmable physical block.

12. The method of claim 11 wherein said symbolic name is derived from said function.

13. The method of claim 1 wherein said constructing the computer-generated source code further comprises:
   reading the template file;
   producing assembly, include, and header files from the template file, wherein said user-specifiable information comprises information specific to said user module, information specific to said function and information specific to a control parameter of said function;
   compiling said assembly, include and header files to produce an executable file;
   downloading said executable file as a code block to a memory of said microcontroller; and
   executing said code block to configure said programmable physical block.

14. A method of configuring a microcontroller having a physical programmable block, said method comprising:
   receiving, at a computer system, a selection of a user module defining a circuit design, wherein said user module comprises information for implementing a function using said programmable physical block, wherein said user module is represented by first markup language data that include information defining how configuration registers for said microcontroller are to be programmed in order to implement said function and wherein said programmable physical block is represented by second markup language data that includes information defining physical addresses of said configuration registers;
   displaying a graphical user interface on a display device of said computer system, said graphical user interface operable for receiving user-specifiable information about said user module, wherein said user-specifiable information comprises configuration information that is used to establish a value for a programmable characteristic of said programmable physical block;
   assigning a virtual block in a design system where said virtual block corresponds to said programmable physical block; and
   automatically constructing assembly code comprising said configuration information for said programmable physical block to implement said circuit design, wherein automatically constructing assembly code further comprises linking said first markup language data and said second markup language data, wherein said assembly code is constructed from template assembly code by substituting said user-specifiable information and information specific to said circuit design for generic information in said template assembly code, and wherein said assembly code contains configuration information for said programmable physical block, wherein said configuration information is based on said user-specifiable information and comprises information that when loaded into a register of said programmable physical block cause said programmable physical block to perform said function.

15. The method of claim 14, wherein said automatically constructing further comprises:
   computing a register address for a register within said programmable physical block;
   determining a symbolic name for said register address, said symbolic name corresponding to said user module and said circuit design; and
   substituting said symbolic name for a generic name in said template assembly code.

16. The method of claim 14, wherein said automatically constructing further comprises:
   determining a symbolic name corresponding to said user module and said circuit design;
   computing a register address for a register within said programmable physical block;
   assigning said symbolic name to said register address; and
   placing said symbolic name into said assembly code in place of a generic name provided in said template assembly code.

17. The method of claim 15, wherein said automatically constructing further comprises:

reading template files;
substituting said user-specifiable comprising information specific to said user module, information specific to said function and information specific to a control parameter of said function for generic information in said template files to produce assembly, include and header files;
compiling said assembly, include and header files to produce an executable file;
downloading said executable file as a code block to a memory of said microcontroller; and
executing said code block to configure said programmable physical block.

18. A computer system comprising a processor coupled to a bus, a display device coupled to said bus, and a memory coupled to said bus, said memory containing instructions to implement a method for configuring a microcontroller, said method comprising:
displaying on said display device a first graphical user interface comprising a collection of virtual blocks in a design system;
receiving at said computer system a selection of a user module, wherein said user module comprises information for implementing a function using a programmable physical block, said user module represented by first markup language data that includes information defining how configuration registers for said microcontroller are to be programmed in order to implement said function, said programmable physical block represented by second markup language data that includes information defining physical addresses of said configuration registers;
displaying on said display device a second graphical user interface operable for receiving user-specifiable information about said user module;
assigning a virtual block taken from said collection to said user module, wherein said virtual block corresponds to said programmable physical block; and
automatically constructing assembly code holding configuration information for said programmable physical block, wherein said configuration information is based on said user-specifiable information and comprises information that is loaded into a register of said programmable physical block to cause said programmable physical block to perform said function, said automatically constructing comprising:
linking said first markup language data and said second markup language data;
determining a symbolic name corresponding to said user module and said function;
computing a register address for a register within said programmable physical block;
assigning said symbolic name to said register address;
placing said symbolic name into said assembly code;
reading template files;
substituting said user-specifiable comprising information specific to said user module, information specific to said function and information specific to a control parameter of said function for generic information in said template files to produce assembly, include and header files;
compiling said assembly, include and header files to produce an executable file;
downloading said executable file as a code block to a memory of said microcontroller; and
executing said code block to configure said programmable physical block.

19. The computer system of claim 18, wherein said collection is displayed as a two dimensional array.

20. The computer system of claim 18, wherein said assigning further comprises assigning a second virtual block to said user module.

21. The computer system of claim 18, wherein said assembly code further comprises a symbolic name for a register address in said programmable physical block.

22. The computer system of claim 18 wherein said symbolic name is derived from said function.

* * * * *